United States Patent
Nagashima et al.

(10) Patent No.: US 7,520,936 B2
(45) Date of Patent: Apr. 21, 2009

(54) HARDENING PROCESSING APPARATUS, HARDENING PROCESSING METHOD, AND COATING FILM FORMING APPARATUS

(75) Inventors: Shinji Nagashima, Kumamoto (JP); Tomohiro Iseki, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 816 days.

(21) Appl. No.: 10/774,423

(22) Filed: Feb. 10, 2004

(65) Prior Publication Data
US 2004/0161548 A1   Aug. 19, 2004

(30) Foreign Application Priority Data
Feb. 12, 2003   (JP) .............................. 2003-033854

(51) Int. Cl.
B05C 11/00 (2006.01)
B05C 5/00 (2006.01)
F26B 3/34 (2006.01)

(52) U.S. Cl. .................. 118/666; 118/712; 118/643; 118/66; 118/69

(58) Field of Classification Search ............... 118/666, 118/64, 66, 69, 712, 707, 641–643; 34/245, 34/275, 266–269; 427/372.2, 240, 425, 374.1, 427/398.2, 398.4; 438/935
See application file for complete search history.

(56) References Cited

U.S. PATENT DOCUMENTS 4,983,546 A * 1/1991 Hyun et al. .................. 438/800
6,350,316 B1   2/2002 Hayashi et al.
6,398,430 B1 * 6/2002 Jeoung et al. .............. 396/611
6,564,474 B2   5/2003 Nagashima
2002/0195437 A1 * 12/2002 Kusuda ...................... 219/390
2003/0200918 A1 * 10/2003 Nagashima et al. .......... 118/58

FOREIGN PATENT DOCUMENTS

| JP | 62-118527 | 5/1987 |
| JP | 2000-124206 | 4/2000 |
| JP | 2002-190445 | 7/2002 |

* cited by examiner

Primary Examiner—Yewebdar T Tadesse
(74) Attorney, Agent, or Firm—Oblon, Spivak, McClelland, Maier & Neustadt, P.C.

(57) ABSTRACT

The present invention is a hardening processing apparatus for heating a substrate coated with a coating solution to harden the coating film on the substrate, which includes a first processing chamber for mounting the substrate coated with the coating solution on a heating plate and heating the substrate to a predetermined temperature on a one-by-one basis; a first irradiation unit provided in the first processing chamber, for irradiating the substrate mounted on the heating plate with ultraviolet light; and a second processing chamber connected in a communicating manner to the first processing chamber, for mounting the substrate coated with the coating solution on a temperature adjusting plate and adjusting the substrate to a temperature lower than a processing temperature of hardening processing on a one-by-one basis, in which the substrate is heated by the heating plate while being irradiated with the ultraviolet light by the first irradiation unit so that the coating film on the substrate is hardened. Accordingly, it is possible to harden the coating film at a lower temperature than that in the case of no irradiation of ultraviolet light so as to prevent occurrence of adverse effects due to heat to devices.

18 Claims, 13 Drawing Sheets

FIG.6
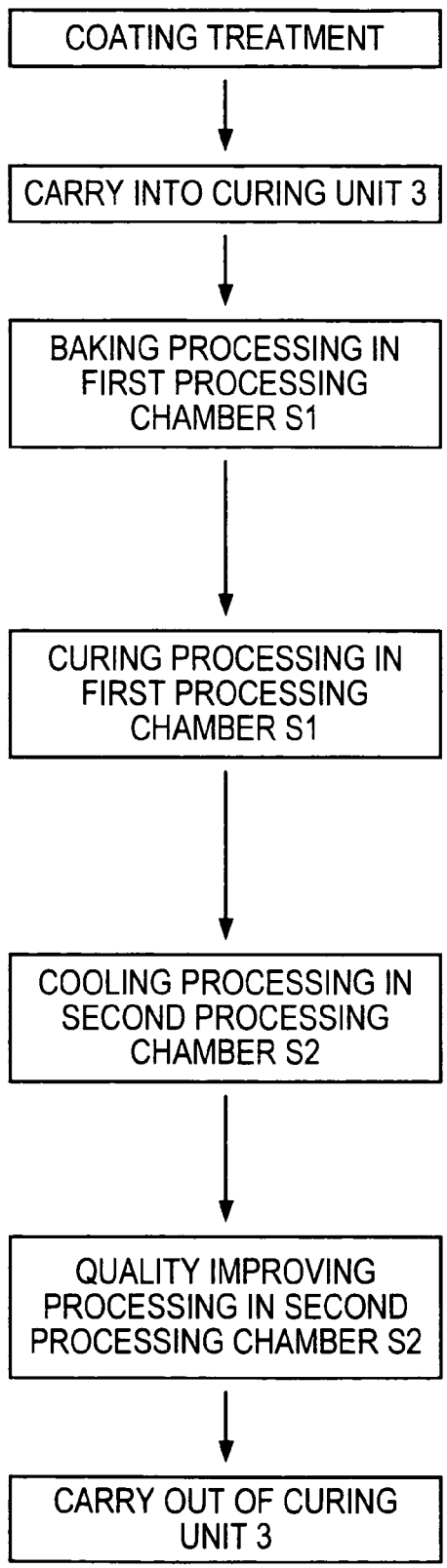
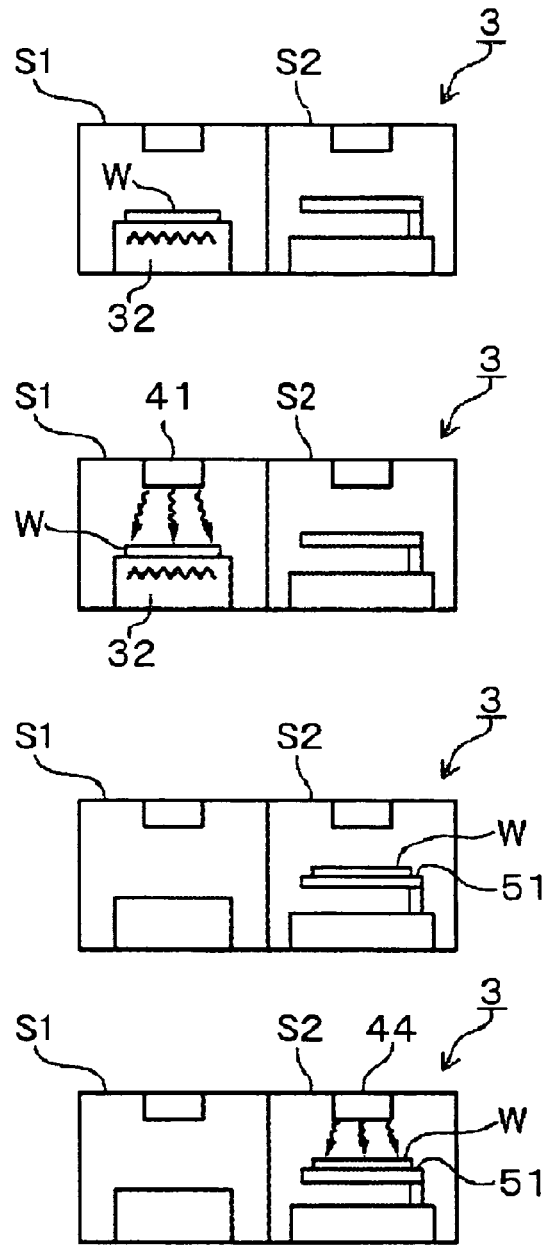

FIG.9
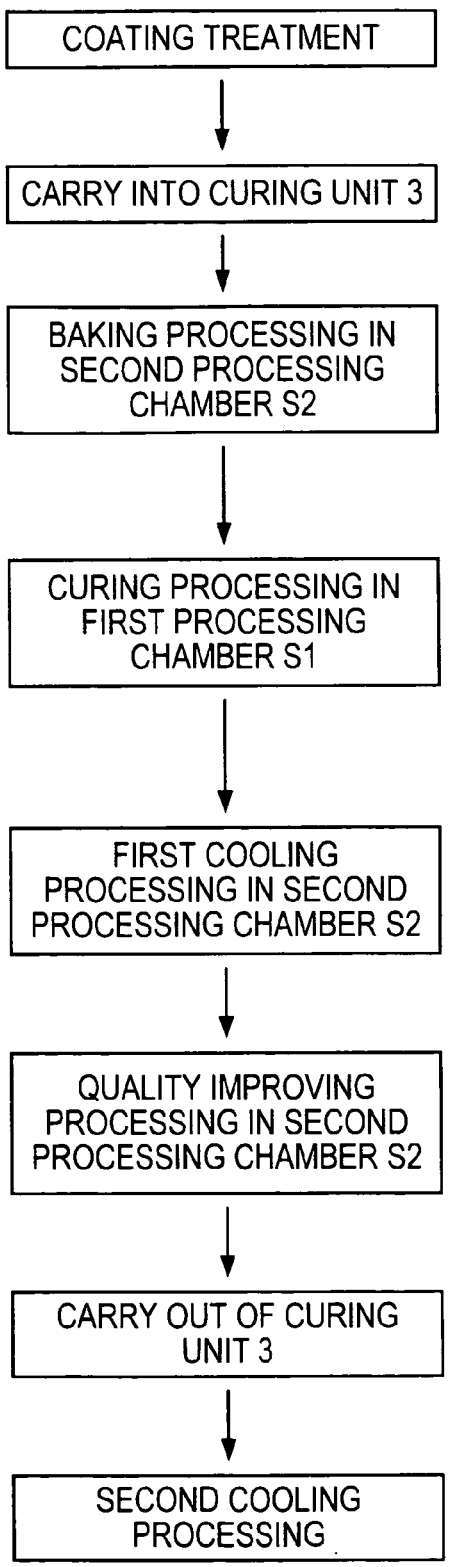
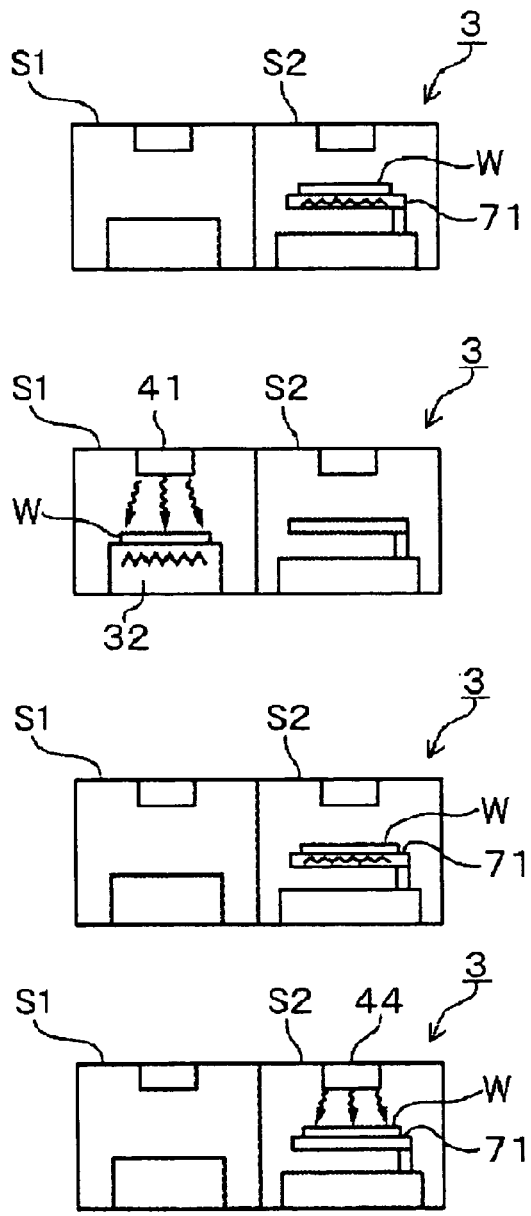

HARDENING PROCESSING APPARATUS, HARDENING PROCESSING METHOD, AND COATING FILM FORMING APPARATUS

BACKGROUND OF THE INVENTION

1. Field of the Invention

The present invention relates to a hardening processing apparatus and method and a coating film forming apparatus each for forming a coating film such as an interlayer insulating film on a substrate such as, for example, a semiconductor wafer, an FPD substrate (flat panel display substrate), and so on.

2. Description of the Related Art

In manufacturing processes of a semiconductor device, there may be a case where an interlayer insulating film is formed by, for example, an SOD (Spin On Dielectric) system. In this SOD system, a coating material is applied by spin coating onto, for example, a semiconductor wafer (hereinafter, referred to as a "wafer") and subsequently subjected to physical processing such as heating and chemical processing to form the interlayer insulating film. Specifically, in the case of using, for example, a coating solution composed of "Silk" (trade name) that is one of cyclobutene based polymer insulating film materials, the interlayer insulating film is formed by performing baking processing of heating at a temperature of, for example, about 320° C. for one minute for the wafer coated with the coating solution and then performing curing processing for about five minutes under the conditions of a temperature at about 450° C. and an oxygen concentration of 20 ppm or lower to harden the coating film.

As an apparatus for performing the curing processing, there is a proposed configuration which includes a processing chamber for heating wafers coated with a coating solution one by one and a cooling processing chamber for cooling the wafer which has been subjected to the heating processing and transferring a wafer to the processing chamber from the outside of the curing apparatus (see Japanese Patent Publication No. 2000-124206). In the processing chamber, predetermined curing processing is performed by mounting a wafer on a hot plate whose set temperature can be set to 200° C. to 470° C.

However, in the configuration disclosed in the published technology, a curing temperature of about 450° C. is required in the case of using the coating solution composed of "Silk" (trade name), but the processing performed at such a high temperature might adversely affect devices due to heat in the future when the pattern becomes finer.

SUMMARY OF THE INVENTION

The present invention is developed under such a circumstance, and its object is to provide a technology of performing hardening processing for hardening a coating film while irradiating a substrate with ultraviolet light so as to lower a processing temperature during the hardening processing.

The present invention is a hardening processing apparatus for heating a substrate coated with a coating solution to harden the coating film on the substrate, which includes a first processing chamber for mounting the substrate coated with the coating solution on a heating plate and heating the substrate to a predetermined temperature on a one-by-one basis; a first irradiation unit provided in the first processing chamber, for irradiating the substrate mounted on the heating plate with ultraviolet light; and a second processing chamber connected in a communicating manner to the first processing chamber, for mounting the substrate coated with the coating solution on a temperature adjusting plate and adjusting the substrate to a temperature lower than a processing temperature of hardening processing on a one-by-one basis.

In the present invention, the substrate is heated by the heating plate while being irradiated with the ultraviolet light by the first irradiation unit so that the coating film on the substrate is hardened.

In such a hardening processing apparatus, since the coating film on the substrate is hardened by heating the substrate while irradiating the substrate with the ultraviolet light, it is possible to harden the coating film at a lower temperature than that in the case of no irradiation of ultraviolet light so as to prevent occurrence of adverse effects due to heat to devices.

A hardening processing method of the present invention comprises: a heating processing step of mounting a substrate coated with a coating solution on a heating plate and heating the substrate to a first temperature on a one-by-one basis; and then a hardening processing step of subsequently heating on a one-by-one basis the substrate for which the heating processing has been performed, kept mounted on the heating plate, to a temperature of the hardening processing that is higher than the first temperature, and irradiating the substrate with ultraviolet light having a predetermined wavelength to harden the coating film on the substrate.

In another viewpoint of the present invention, a hardening processing method of the present invention comprises: a heating processing step of mounting a substrate coated with a coating solution on a temperature adjusting plate and heating the substrate to a first temperature on a one-by-one basis; and then a hardening processing step of positioning the temperature adjusting plate, on which the substrate for which the heating processing has been performed is mounted, above a heating plate, raising a raising and lowering mechanism from the heating plate for the raising and lowering mechanism to receive the substrate on the temperature adjusting plate, then moving the temperature adjusting plate to an outside of the heating plate, and thereafter lowering the raising and lowering mechanism to thereby transfer the substrate from the temperature adjusting plate to the heating plate, heating on a one-by-one basis the substrate to a temperature of the hardening processing that is higher than the first temperature, and irradiating the substrate with ultraviolet light having a predetermined wavelength to harden the coating film on the substrate.

Accordingly, since the coating film on the substrate is hardened by heating the substrate while irradiating the substrate with the ultraviolet light, it is possible to harden the coating film at a lower temperature than that in the case of no irradiation of ultraviolet light so as to prevent occurrence of adverse effects due to heat to devices.

BRIEF DESCRIPTION OF THE DRAWINGS

FIG. 6 is a flowchart for explaining the flow of a wafer in the coating film forming apparatus in FIG. 1;

FIG. 9 is a flowchart for explaining the flow of a wafer in the coating film forming apparatus in which the hardening processing apparatus in FIG. 8 is incorporated;

DETAILED DESCRIPTION OF THE INVENTION

Figure 1:
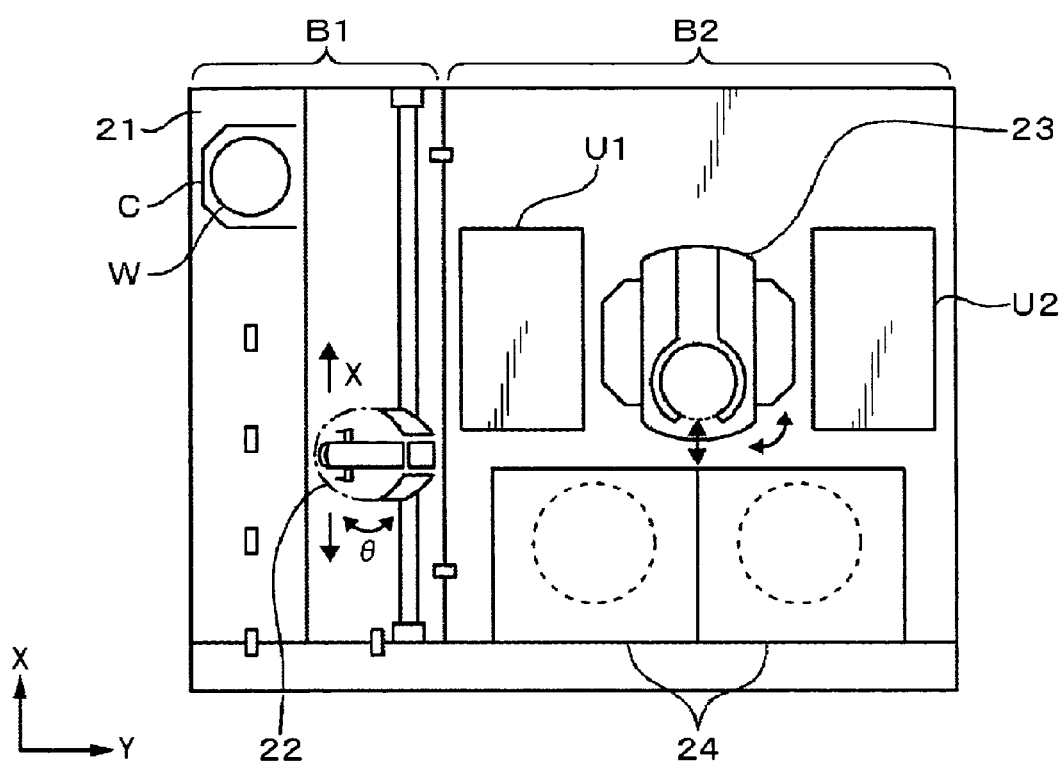
FIG. 1 is a plan view showing an entire configuration of an embodiment of a coating film forming apparatus according to the present invention.
Figure 2:
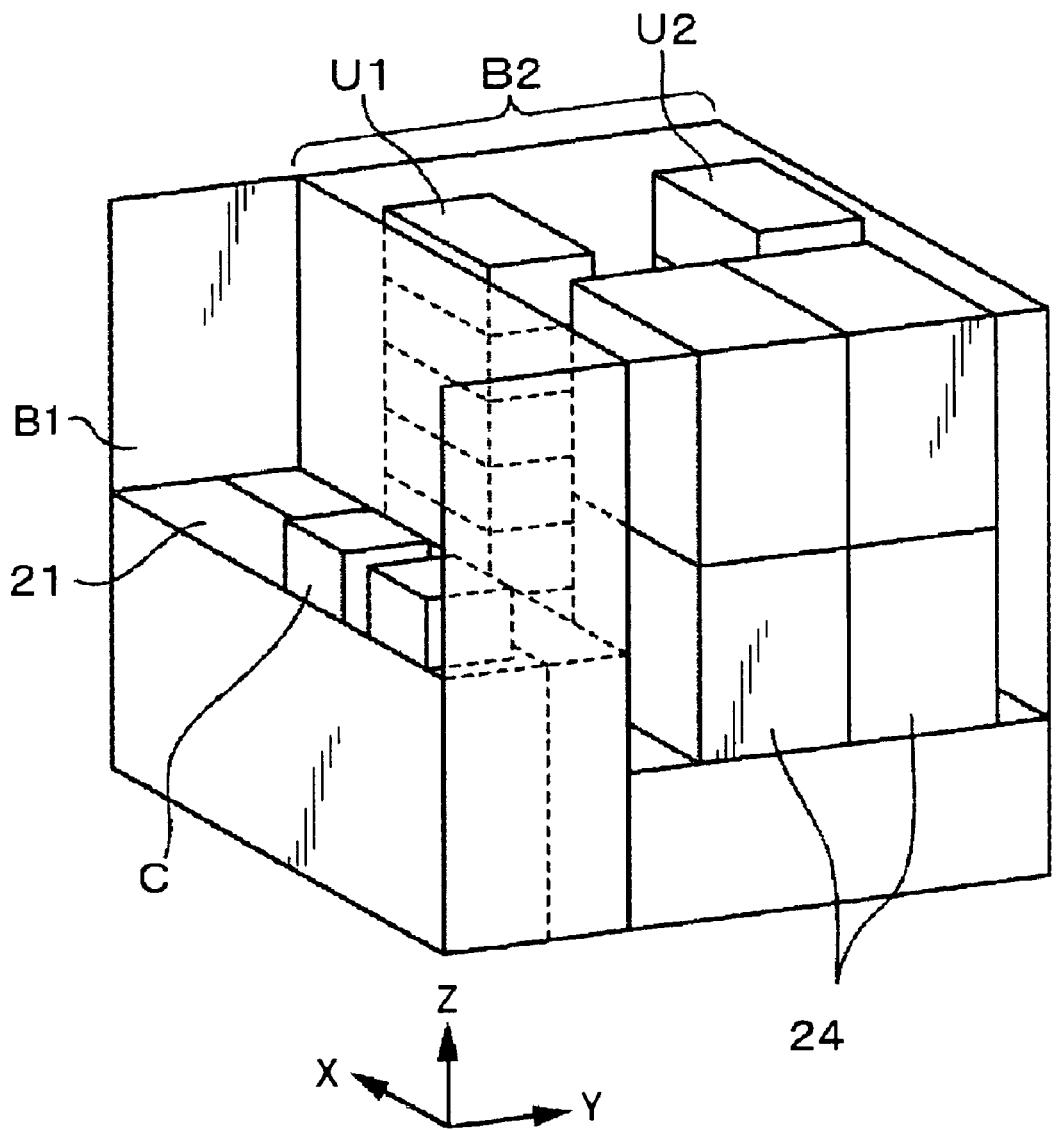
FIG. 2 is a schematic perspective view showing the entire configuration of the coating film forming apparatus in FIG. 1.

An embodiment of a coating film forming apparatus in which a hardening processing apparatus of the present invention is built in will be described hereinafter by taking, as an example, a case of forming an interlayer insulating film made of an $SiO_2$ film using a coating solution composed of, for example, "Silk" (trade name). FIG. 1 is a plan view showing an entire configuration related to the embodiment of the coating film forming apparatus of the present invention, FIG. 2 is a schematic perspective view thereof, and FIG. 3 is a vertical cross-sectional view thereof.

In the drawings, B1 denotes a carrier block for carrying in/out a substrate carrier C (hereinafter referred to as a "carrier"), in which, for example, 25 wafers W being substrates are accommodated, and this carrier block B1 includes a carrier mounting section 21 on which the carrier C is mounted and a transfer means 22. The transfer means 22 is configured to be movable right and left and back and forth, ascendable and descendable, and rotatable around the vertical axis so as to take out the wafer W from the carrier C and transfer the taken out wafer W to a processing block B2 that is provided adjacent to the carrier block B1.

In the center of the processing block B2, a main carrier means 23 constituting a carrier means is provided, and in such a manner to surround the main carrier means 23, a plurality of coating units (SCT) 24 are arranged on the right side, when viewing, for example, the rear side, and shelf units U1 and U2 in each of which a plurality of processing units are multi-tiered are arranged on the front side and on the rear side respectively. The shelf units U1 and U2 are constituted by combining various kinds of units for performing pre-processing and post-processing of the processing in the coating units 24, and thus include, for example, temperature adjusting units (CPL) 25 each for temperature-adjusting the wafer to a pre-determined temperature before coating of a coating solution and curing units (DLC) 3 each constituting a hardening processing apparatus for performing processing of heating the wafer to harden the coating film, in the combination as shown, for example, in FIG. 3. Besides, the shelf unit U1 also incorporates a transfer unit (TRS) 26 provided with a transfer table for transferring the wafer W.

Figure 3:
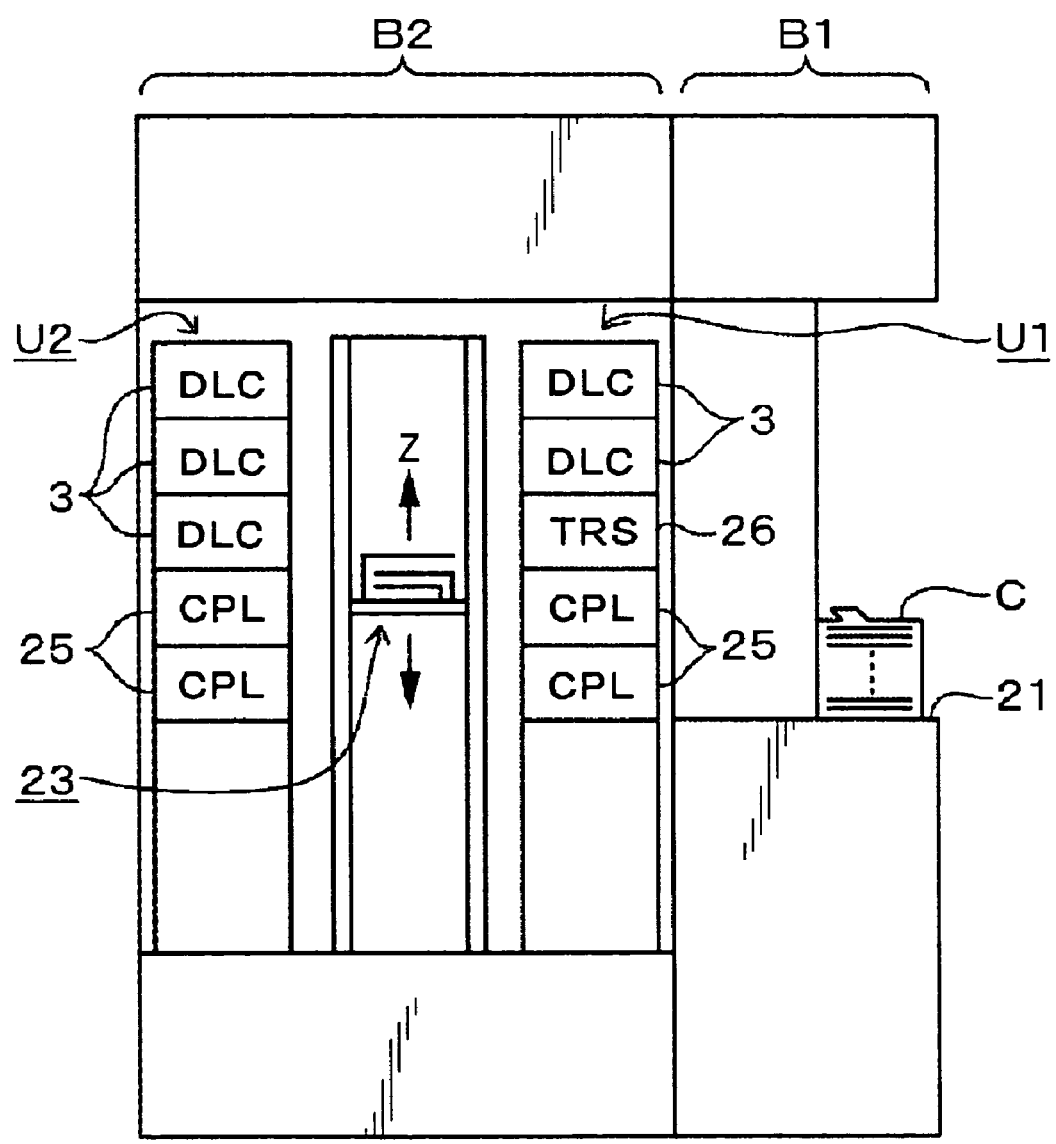
FIG. 3 is a side view showing the entire configuration of the coating film forming apparatus in FIG. 1.

The configuration of each of the shelf units U1 and U2 shown in FIG. 3 is one example, and it is also adoptable to arrange processing units other than the already described processing units in accordance with processing to be performed for the wafer W, and it is possible to arbitrarily select the number and layout of the units. The above-described main carrier means 23 is configured to be, for example, ascendable and descendable, movable right and left, and rotatable around the vertical axis so as to be able to transfer the wafer W between the coating units 24 and the units constituting the shelf units U1 and U2.

Figure 4:
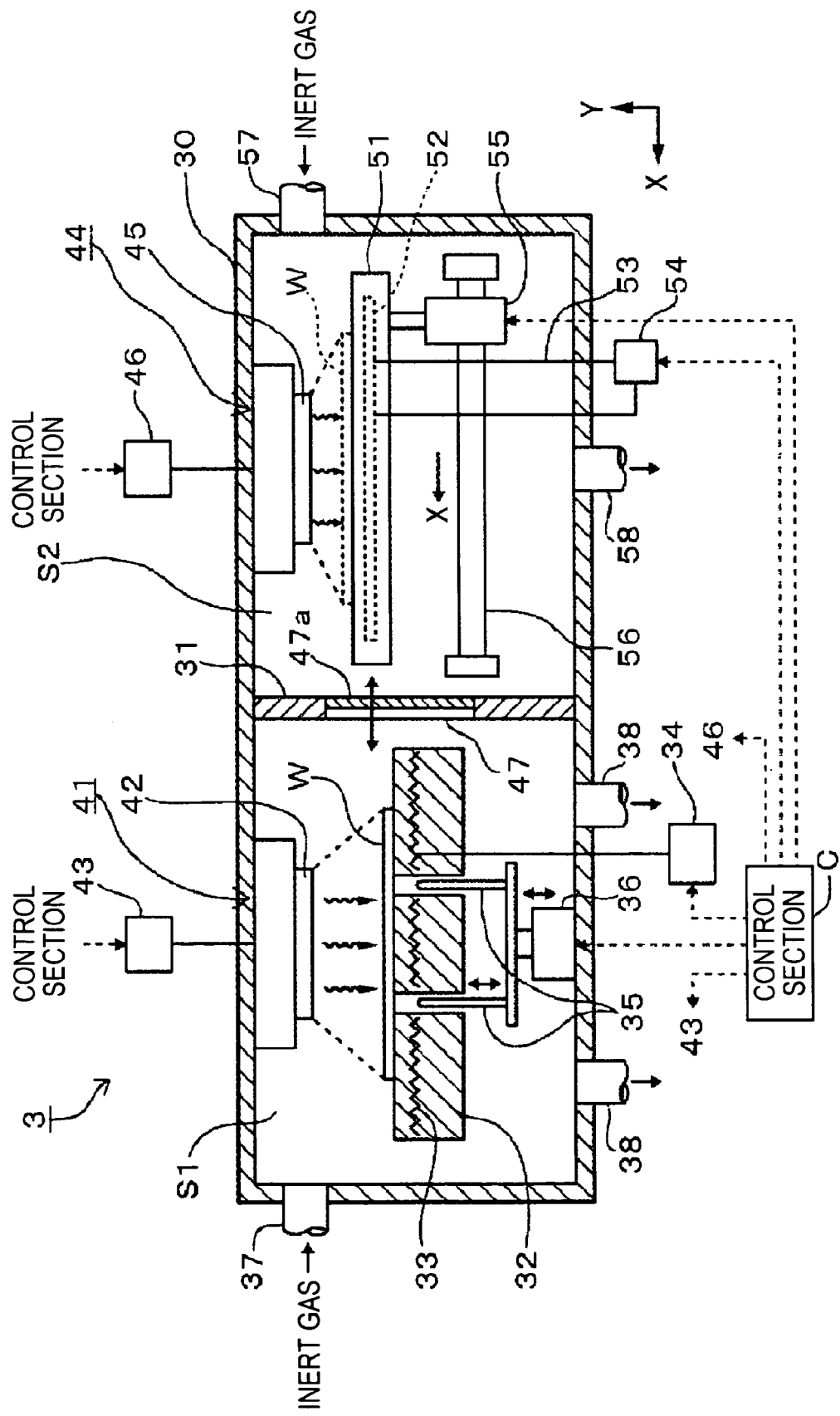
FIG. 4 is a cross-sectional view of a hardening processing apparatus (curing unit) provided in the coating film forming apparatus in FIG. 1.

Subsequently, the aforementioned curing unit 3 will be described with reference to FIG. 4 and FIG. 5, and the curing unit 3 constitutes the hardening processing apparatus of the present invention as described above and is a unit for performing hardening processing of burning the coating film to harden. Numeral 30 in the drawings denotes a casing, and the inside of the casing 30 is divided into two parts by a partition plate 31, in which the part on the left side in the drawings is formed as a first processing chamber S1 and the part on the right side is formed as a second processing chamber S2. These processing chambers S1 and S2 are configured to be hermetically sealable so that the inside of each of the processing chambers S1 and S2 can be set to a predetermined atmosphere.

Inside the first processing chamber S1, a heating plate 32, for example, in a circular plane shape is provided for mounting and heating the wafer W. This heating plate 32 is made of, for example, ceramics such as silicon carbide or aluminum nitride that is excellent, for example, in heat conductivity. Besides, the heating plate 32 has a built-in heater 33, which is a heating means, by which the wafer W mounted on the heating plate 32 is heated to, for example, 300° C. to 470° C. Numeral 34 in the drawing denotes a power source unit of the heater 33, and the power source unit 34 is configured such that a control section C controls the amount of power supply from the power source unit 34 to the heater 33 to maintain the heating plate 32 at a predetermined temperature.

Numeral 35 in the drawings denotes a raising and lowering pin for raising and lowering the wafer W while supporting the rear surface thereof, and the raising and lowering pins 35 are configured to be ascendable and descendable by a raising and lowering mechanism 36. Driving of the raising and lowering mechanism 36 is controlled by the control section C, so that the raising and lowering pins 35 can raise and lower the wafer W to a predetermined height at a predetermined timing. In this embodiment, the raising and lowering pins 35 and the raising and lowering mechanism 36 constitute a raising and lowering member in claims.

On the upper side inside the first processing chamber S1, a first irradiation unit 41 is provided at a position substantially facing the heating plate 32 and provided with a first light source 42 for irradiating the entire front surface of the wafer W mounted on the heating plate 32 with ultraviolet light for hardening processing having a wavelength within a predetermined range, for example, about 100 nm to about 500 nm. Numeral 43 in the drawing denotes a controller of the light source 42, and via the controller 43 the control section C controls the amount of power supply to the light source 42 and the wavelength of the light source 42.

It is preferable here to set the wavelength to 200 nm to 400 nm and the amount of irradiation to about 100 $J/cm^2$ to about 500 $J/cm^2$ ($J/cm^2$: unit of the amount of irradiation (the integrated amount of light)) when curing processing is performed for an organic SOD film, and the wavelength to 100 nm to 200 nm and the amount of irradiation to about 100 $J/cm^2$ to about 300 $J/cm^2$ when curing processing is performed for an inorganic SOD film.

A side surface of the casing 30 of the first processing chamber S1 is provided with an inert gas supply unit 37 for supplying an inert gas such as, for example, helium gas or nitrogen gas into the first processing chamber S1 from a not-shown supply source. Further, to a bottom surface of the casing 30 of the first processing chamber S1, an exhaust path 38 for exhausting the atmosphere in the processing chamber is connected. Accordingly, air in the first processing chamber S1 is exhausted while the inert gas is supplied thereinto, whereby the inside of the processing chamber S1 can be maintained in a predetermined atmosphere, for example, in a low oxygen atmosphere with an oxygen concentration of 5 ppm to 20.6%.

The second processing chamber S2 will be described. Inside the second processing chamber S2, a temperature adjusting plate 51, for example, in a plate shape is provided for mounting the wafer thereon and adjusting the wafer to a predetermined temperature. This temperature adjusting plate 51 is sized such that when the wafer is mounted thereon, the entire rear surface of the wafer comes into contact with the front surface of the temperature adjusting plate 51, and is made of ceramics such as, for example, silicon carbide or aluminum nitride that is excellent, for example, in heat conductivity. Further, this plate 51 is formed with a refrigerant flow path 52 through which a refrigerant adjusted at a predetermined temperature passes, whereby the wafer W mounted on the temperature adjusting plate 51 is adjusted to a predetermined temperature selected from among, for example, 15° C. to 50° C. Numeral 53 in the drawing denotes a supply path for circularly supplying the refrigerant to the refrigerant flow path 52, and numeral 54 denotes a temperature adjusting unit of the refrigerant. The temperature adjusting unit 54 is controlled by the control section C, whereby the temperature adjusting plate 51 is maintained at a predetermined temperature.

The temperature adjusting plate 51 is configured to be movable in almost the horizontal direction between the inside of the second processing chamber S2 and a position above the heating plate 32 in the first processing chamber S1 along a guide rail 56 extended in an X direction (a direction from the second processing chamber S2 side toward the first processing chamber S1 side) in the second processing chamber S2.

Figure 5:
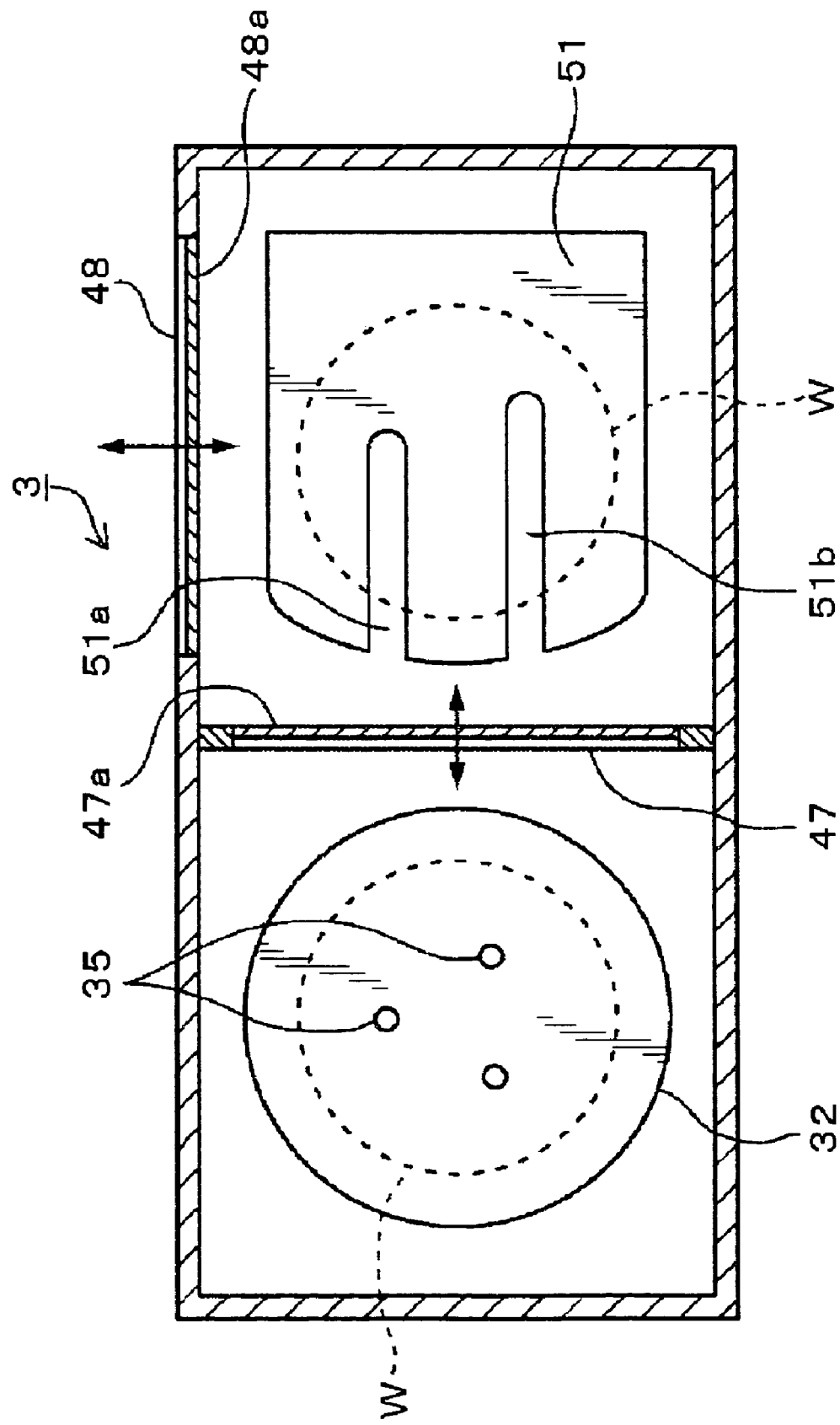
FIG. 5 is a plan view showing an internal appearance of the hardening processing apparatus in FIG. 4.

The temperature adjusting plate 51 is formed with cut-outs 51a and 51b in a slit shape as shown in FIG. 5. The cut-outs 51a and 51b are formed at positions where when the raising and lowering pins 35 of the heating plate 32 are raised or lowered with the temperature adjusting plate 51 positioned above the heating plate 32, the raising and lowering pins 35 never interfere with the temperature adjusting plate 51. Accordingly, the wafer is transferred between the temperature adjusting plate 51 and the heating plate 32.

More specifically, when the wafer W mounted on the temperature adjusting plate 51 is transferred to the heating plate 32, the temperature adjusting plate 51 is positioned above the heating plate 32, the raising and lowering pins 35 are raised to receive the wafer, subsequently the temperature adjusting plate 51 is retracted into the second processing chamber S2, and thereafter the raising and lowering pins 35 are lowered, whereby the wafer W is transferred from the temperature adjusting plate 51 to the heating plate 32. Conversely, when the wafer mounted on the heating plate 32 is transferred to the temperature adjusting plate 51, the raising and lowering pins 35 are raised to receive the wafer from the heating plate 32, subsequently the temperature adjusting plate 51 is positioned between the wafer W and the heating plate 32, and thereafter the raising and lowering pins 35 are lowered, whereby the wafer W is transferred from the heating plate 32 to the temperature adjusting plate 51.

On the upper side inside the second processing chamber S2, a second irradiation unit 44 for irradiating the entire front surface of the wafer W mounted on the temperature adjusting plate 51 with ultraviolet light for quality improvement is provided at a position substantially opposed to the temperature adjusting plate 51 and provided with a second light source 45 for irradiating the wafer mounted on the temperature adjusting plate 51 with ultraviolet light for quality improvement having a wavelength within a predetermined range, for example, about 100 nm to about 300 nm. Numeral 46 in the drawing denotes a controller of the light source 45, and via the controller 46 the control section C controls the amount of power supply to the light source 45 and the wavelength of the light source 45. When quality improving processing is performed here, it is preferable to set the wavelength to 150 nm to 200 nm and the amount of irradiation to about 100 J/cm$^2$ for both an organic SOD film and an inorganic SOD film.

A side surface of the casing 30 of the second processing chamber S2 is provided with an inert gas supply unit 57 for supplying an inert gas such as, for example, helium gas or nitrogen gas into the second processing chamber S2 from a not-shown supply source. Further, to a bottom surface of the casing 30 of the second processing chamber S2, an exhaust path 58 for exhausting the atmosphere in the processing chamber is connected. Accordingly, air in the second processing chamber S2 is exhausted while the inert gas is supplied thereinto, whereby the inside of the processing chamber S2 can be maintained in a predetermined atmosphere, for example, in a low oxygen atmosphere with an oxygen concentration of 5 ppm to 20.5%.

The partition plate 31 is provided with a passing port 47 for the temperature adjusting plate 51 to pass therethrough, and the passing port 47 is provided with a shutter 47a that moves up and down, for example. Further, a side surface of the casing 30 of the second processing chamber S2 is provided with a carrier port 48 for carrying the wafer W into/out of the curing unit 3, and the carrier port 48 is configured to be freely open and close with a shutter 48a. Accordingly, the shutters 47a and 48a are closed other than when the wafer W is carried into/out of the curing unit 3 and when the wafer is carried between the first processing chamber S1 and the second processing chamber S2, so that the atmosphere in each of the processing chambers S1 and S2 can be maintained.

A configuration of the coating unit 24 will be briefly described next. The coating unit 24 is a unit that performs processing of applying the coating solution to the front surface of the wafer, and in this unit 24 the wafer is first transferred, for example, by the main carrier means 23 to a spin chuck being a substrate holding portion, and the coating solution for a coating film is applied by a supply nozzle to almost the central portion of the front surface of the wafer W, while the spin chuck is rotated at a previously set number of rotations to thereby spread the coating solution in the radial direction of the wafer W by the centrifugal force, whereby the processing of forming a solution film of the coating solution on the front surface of the wafer W is performed. As such a coating unit 24, a known spin coat-type coating apparatus can be used. Besides, in the temperature adjusting unit 25, processing of adjusting the wafer to a predetermined temperature is performed by mounting the wafer for a predetermined period on the front surface of a cooling plate constituting the substrate mounting portion in the processing chamber.

The flow of a wafer in such a coating film forming apparatus is described with reference to FIG. 6; the carrier C accommodating, for example 25 wafers W is carried from the outside into the carrier mounting section 21 in the carrier block B1 by an automatic carrier robot (or an operator). Then, the wafer W is taken out of the carrier C by the transfer means 22 and transferred to the main carrier means 23 via the transfer unit 26 of the shelf unit U1 in the processing block B2.

Subsequently, the wafer W is carried by the main carrier means 23 to the temperature adjusting unit 25 in the shelf unit U1 or U2 in which the wafer W is adjusted to a predetermined temperature, for example, 23° C. and thereafter carried to the coating unit 24 in which the wafer W is subjected to coating treatment of the coating solution composed of, for example, "Silk" (trade name) under a processing temperature of, for example, 23° C.

Subsequently, the wafer W is carried by the main carrier means 23 to the curing unit 3 and transferred via the temperature adjusting plate 51 in the second processing chamber S2 to the heating plate 32 in the first processing chamber S1 in which the wafer W is subjected to baking processing being heating processing. The baking processing is low oxygen heating processing of heating the wafer in a low oxygen atmosphere to cause condensation polymerization reaction to chemically harden the coating film. Specifically, the baking processing is performed by introducing nitrogen gas into the processing chamber S1 to set an atmosphere of a predetermined low oxygen state, for example, at an allowable oxygen concentration of 50 ppm or lower and heating the wafer for about one minute at a first temperature, for example, a temperature of about 320° C.

Subsequently, the wafer W for which the baking processing has been performed is subjected to curing processing being hardening processing in the first processing chamber S1. The curing processing here is heating processing for burning the coating film, which is processing of heating the coating film to thereby perform cross-linking or removal of porogen so as to harden the coating film. Specifically, with the wafer W kept mounted on the heating plate 32 as it is continuously from the baking processing, the inside of the processing chamber S1 is set to an atmosphere of a predetermined low oxygen state, for example, at an allowable oxygen concentration of 20 ppm or lower. On the other hand, the heating plate 32 is heated to a predetermined temperature, and the wafer is heated for about five minutes at a temperature of the hardening processing higher than the first temperature, for example, at a temperature of about 400° C. while the first irradiation unit 41 irradiates the front surface of the wafer W with ultraviolet light having a wavelength of, for example, 300 nm to 400 nm, whereby the hardening processing is performed.

Thereafter, the wafer is transferred from the heating plate 32 to the temperature adjusting plate 51 and subjected to processing of cooling the wafer to room temperature by the temperature adjusting plate 51 in the second processing chamber S2. In this event, the temperature of the temperature adjusting plate 51 being set to about 23° C., the wafer is mounted on the temperature adjusting plate 51 and kept stand as it is for about one minute, whereby the wafer is cooled to about room temperature.

Subsequently, processing of improving the quality of the front surface of the coating film formed on the front surface of the wafer W is performed in the second processing chamber S2. More specifically, with the wafer W continuously kept mounted on the temperature adjusting plate 51, the second irradiation unit 44 irradiates the front surface of the wafer with ultraviolet light for quality improvement, for example, ultraviolet light having a wavelength of about 172 nm for, for example, about 10 seconds, to thereby improve the quality of the front surface of the coating film. Then, the wafer W is carried out of the curing unit 3. More specifically, the wafer W is transferred from the temperature adjusting plate 51 to the main carrier means 23, and returned from the main carrier means 23 via the transfer unit 26 of the shelf unit U1 and the transfer means 22 to, for example, the original carrier C.

Carriage of the wafer in the coating film forming apparatus and processing of the wafer in each processing unit such as the curing unit 3 are performed based on a program in the control section C. More specifically, the control section C includes a program for performing the baking processing of mounting the wafer W on the heating plate and heating the wafer W at the first temperature in the first processing chamber S1 of the curing unit 3, and then the hardening processing of hardening the coating film on the wafer by irradiating the wafer with ultraviolet light having a predetermined wavelength while subsequently heating the wafer W for which the baking processing has been performed, kept mounted on the heating plate, at the temperature of the hardening processing that is higher than the first temperature.

In such a configuration, thermal energy is provided to the coating film while the coating film is irradiated with ultraviolet light in the curing processing, so that the thermal energy and the energy of the ultraviolet light are combined to harden the coating film. Therefore, the processing temperature can be made lower, without extension of the processing period, than in the case in which the coating film is hardened only by the thermal energy. Accordingly, thermal effects to devices can be eliminated to secure reliable devices. Further, since there is no need to extend the processing period, a reduction in throughput can be prevented.

Figure 7:
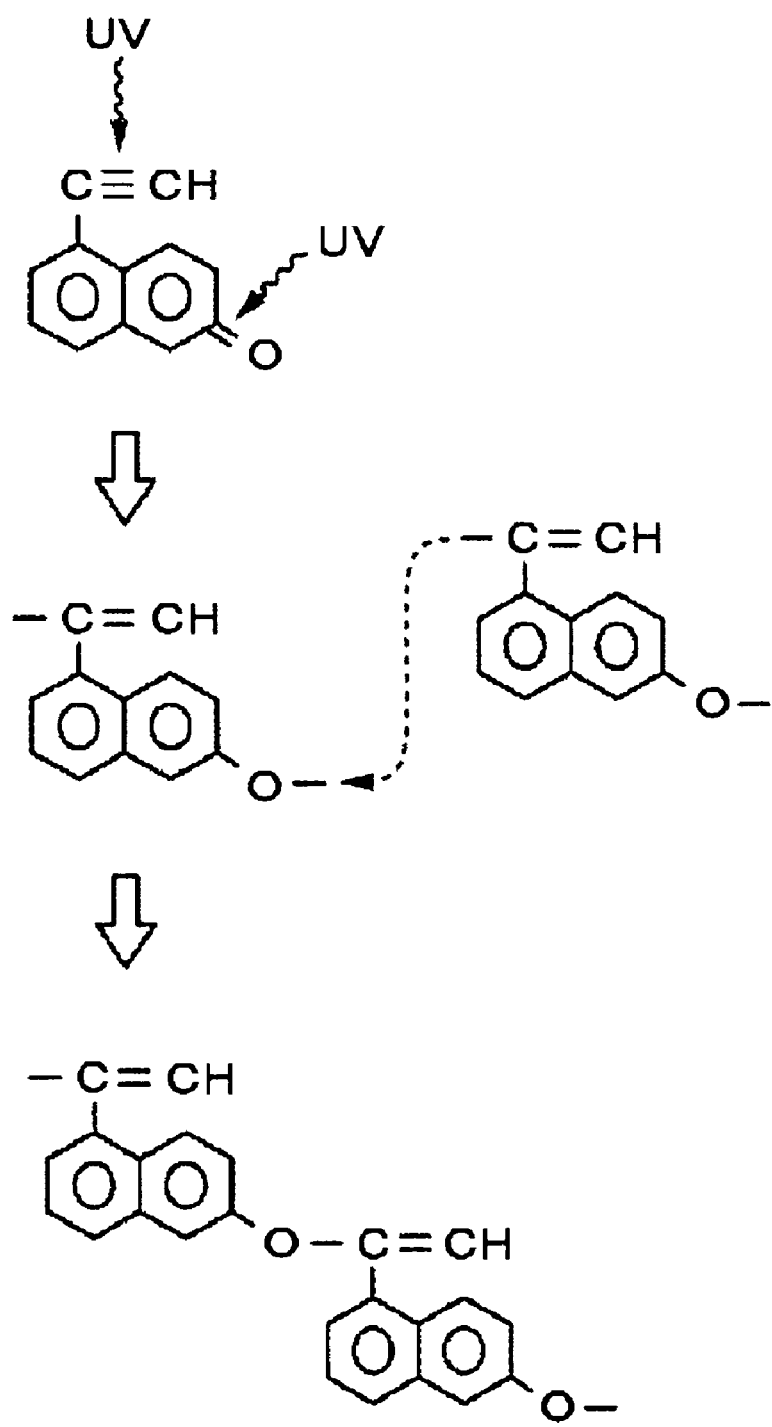
FIG. 7 is an explanatory view for explaining the operation of the hardening processing apparatus in FIG. 4.

The reason why the combination of the thermal energy and the energy of the ultraviolet light enables the coating film to be hardened at a lower temperature will be described here. In the curing processing, as shown in FIG. 7, porogen is vaporized to thereby cut one bond of each of a triple bond of acetylene and a double bond of oxygen, and cut molecules are bonded to each other as shown by a dotted line to form a polymer, in which the vaporization temperature of porogen that is high is one of the causes of an increase in the temperature of the curing processing.

Meanwhile, when the coating film is irradiated with ultraviolet light in the curing processing, the vaporization of porogen is accelerated by the ultraviolet light, resulting in a state in which bonds of acetylene and oxygen are easy to cut. On the other hand, cut molecules are bonded to each other by heating energy at about 400° C. As described above, owing to the irradiation with ultraviolet light, the bonds of acetylene and oxygen can be cut at a temperature lower than that in the case of no irradiation with ultraviolet light, and the cut molecules are bonded to each other at this low temperature, so that the coating film can be hardened at a temperature lower than that in the case of no irradiation with ultraviolet light.

Besides, since the baking processing and curing processing are performed in the same processing apparatus in this embodiment, necessary processing units are fewer in number than in the case of separately preparing different apparatuses for them. This enables a reduction in cost and footprint, leading to effectiveness in terms of space. Further, when a baking processing apparatus and a curing processing apparatus are prepared separately, the wafer W is carried by the main carrier means 23 from the baking processing apparatus to the curing processing apparatus, in which if the baking processing apparatus and the curing processing apparatus are located at places distant from each other, the distance to be carried becomes longer to require time for carriage, resulting in degradation in throughput. Further, since the number of processing units to which the main carrier means 23 carries the wafer increases, resulting in complicated carriage program.

In contrast to the above, when an arrangement is made such that the baking processing and the curing processing are performed in the same processing chamber S1 of the curing unit 3 as in the present invention, there is no need to carry the wafer between the baking processing and the curing processing, and therefore the total processing period can be accordingly reduced, resulting in improved throughput.

Besides, in the above-described embodiment, since the second irradiation unit 44 for irradiating with the ultraviolet light for quality improvement is provided to irradiate the wafer, for which the hardening processing has been performed, with the ultraviolet light for quality improvement, organic bonds on the front surface of the coating film are cut so that the adhesion between the coating film and a subsequent film can be enhanced. In this case, provision of the second irradiation unit 44 in the second processing chamber S2 is more effective in terms of space than in the case in which an irradiation unit for quality improvement is provided separately from the curing unit 3, and also effective in terms of throughput because the wafer is cooled by the temperature adjusting plate 51 and subsequently can be subjected to the quality improving processing without carriage of the wafer, requiring no time for carriage of the wafer.

In addition, since the coating film is subjected to the baking processing and the hardening processing under the same atmosphere and thus never comes into contact with an atmosphere outside the processing apparatus during the processing, OH groups that adversely affect the insulation performance never attach to the film.

Figure 8:
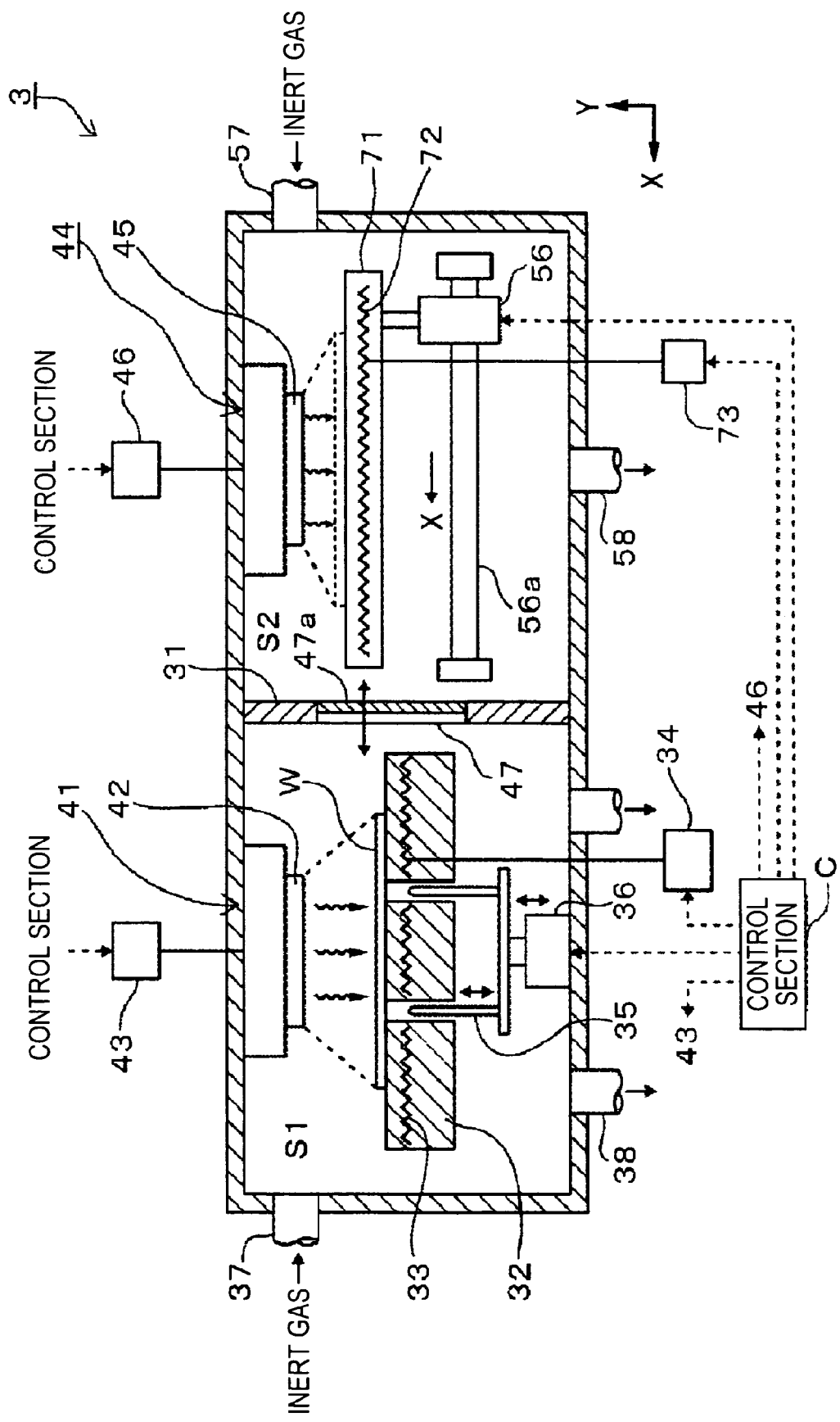
FIG. 8 is a cross-sectional view of another embodiment of the hardening processing apparatus.

Next, another embodiment of the present invention will be described using FIG. 8. This embodiment is different from the above-described embodiment in the point that the baking processing is performed in the second processing chamber S2 of the curing unit 3, and therefore a temperature adjusting plate 71 includes a heater 72 that constitutes a heating means embedded therein in place of the refrigerant flow path. Numeral 73 in the drawing denotes a power source unit of the heater 72, and the power source unit 73 is configured such that a control section C controls the amount of power supply from the power source unit 73 to the heater 72 to maintain the temperature adjusting plate 71 at a predetermined temperature, so that the wafer W mounted on the temperature adjusting plate 71 is heated to, for example, 50° C. to 200° C. The other configuration is the same as that of the above-described curing unit 3, but a cooling unit is separately required for cooling the wafer to a temperature at about room temperature after the processing in the curing unit 3. This cooling unit is configured similarly to, for example, the temperature adjusting unit 25 and incorporated in the shelf units U1 and U2.

The flow of a wafer in this embodiment is described with reference to FIG. 9; the flow is the same as that in the above-described embodiment from the coating treatment of the coating solution performed in the coating unit 24 to carriage by the main carrier means 23 to the curing unit 3. Thereafter, the wafer W is transferred to the temperature adjusting plate 71 in the second processing chamber S2 in which the wafer W is subjected to baking processing that is heating processing. More specifically, the baking processing is performed by introducing nitrogen gas into the processing chamber S2 to set an atmosphere of a predetermined low oxygen state, for example, at an allowable oxygen concentration of 50 ppm or lower and heating the wafer W for about one minute at a first temperature of 200° C. or lower, for example, a temperature of about 150° C.

Subsequently, the wafer W for which the baking processing has been performed is transferred from the temperature adjusting plate 71 to the heating plate 32 in the first processing chamber S1 in which the wafer W is subjected to curing processing being hardening processing. More specifically, the inside of the processing chamber S1 is set to an atmosphere of a predetermined low oxygen state, for example, at an allowable oxygen concentration of 20 ppm or lower. On the other hand, the heating plate 32 is heated to a predetermined temperature, and the wafer is heated for about five minutes at a temperature of the hardening processing higher than the first temperature, for example, at a temperature of about 400° C. while the first irradiation unit 41 irradiates the front surface of the wafer W with the ultraviolet light having a wavelength of, for example, 300 nm to 400 nm, whereby the hardening processing is performed.

Subsequently, the wafer W is transferred from the heating plate 32 to the temperature adjusting plate 71 and subjected to processing (first cooling processing) of cooling the wafer to almost the same temperature as that of the baking processing, for example, about 150° C. by the temperature adjusting plate 71 in the second processing chamber S2. In this event, the temperature of the temperature adjusting plate 71 being set to about 150° C., the wafer is mounted on the temperature adjusting plate 71 and kept stand as it is for about one minute, whereby the wafer is cooled to the temperature of about 150° C.

Subsequently, processing of improving the quality of the front surface of the coating film formed on the front surface of the wafer W is performed in the second processing chamber S2. More specifically, with the wafer W is continuously kept mounted on the temperature adjusting plate 71, the second irradiation unit 44 irradiates the front surface of the wafer with ultraviolet light for quality improvement, for example, ultraviolet light having a wavelength of 172 nm for, for example, about 10 seconds, to thereby improve the quality of the front surface of the coating film. Then, the wafer W is carried out of the curing unit 3 and transferred by the main carrier means 23 to the cooling unit, in which the wafer is subjected to processing (second cooling processing) of cooling the wafer to room temperature, for example, about 23° C. Thereafter, the wafer W is returned from the main carrier means 23 via the transfer unit 26 of the shelf unit U1 and the transfer means 22 to, for example, the original carrier C.

In this embodiment, the control section C includes a program for performing the baking processing of mounting the wafer W coated with the coating solution on the temperature adjusting plate 71 and heating the wafer W at the first temperature in the second processing chamber S2, and then the hardening processing of hardening the coating film on the wafer by mounting the wafer W for which the baking processing has been performed in the first processing chamber S1 on the heating plate 32 and irradiating the wafer with ultraviolet light having a predetermined wavelength while heating the wafer W at the temperature of the hardening processing that is higher than the first temperature.

As described above, in this embodiment, the baking processing is performed at a temperature of 200° C. or lower in the second processing chamber S2, and the first heating to the temperature of 200° C. or lower in the baking processing and the subsequent heating to about 400° C. in the curing processing gradually heat the wafer in which temperature slowly changes, and is therefore effective to the coating film made of a material susceptible to damage caused by a rapid temperature change.

Also in this configuration, thermal energy is provided to the coating film while the coating film is irradiated with ultraviolet light in the curing processing, and the baking processing and the curing processing are performed in the same processing apparatus, so that the same effects as those in the above-described embodiment can be obtained. Besides, in this embodiment, the baking processing is performed in the second processing chamber S2 and the curing processing is performed in the first processing chamber S1, between which the wafer is carried by the temperature adjusting plate 71, and therefore the carriage time can be made shorter and the carriage program also becomes simpler than in the case in which a baking processing apparatus and a curing processing apparatus are separately prepared and the wafer is carried between them by the main carrier means 23.

Figure 10:
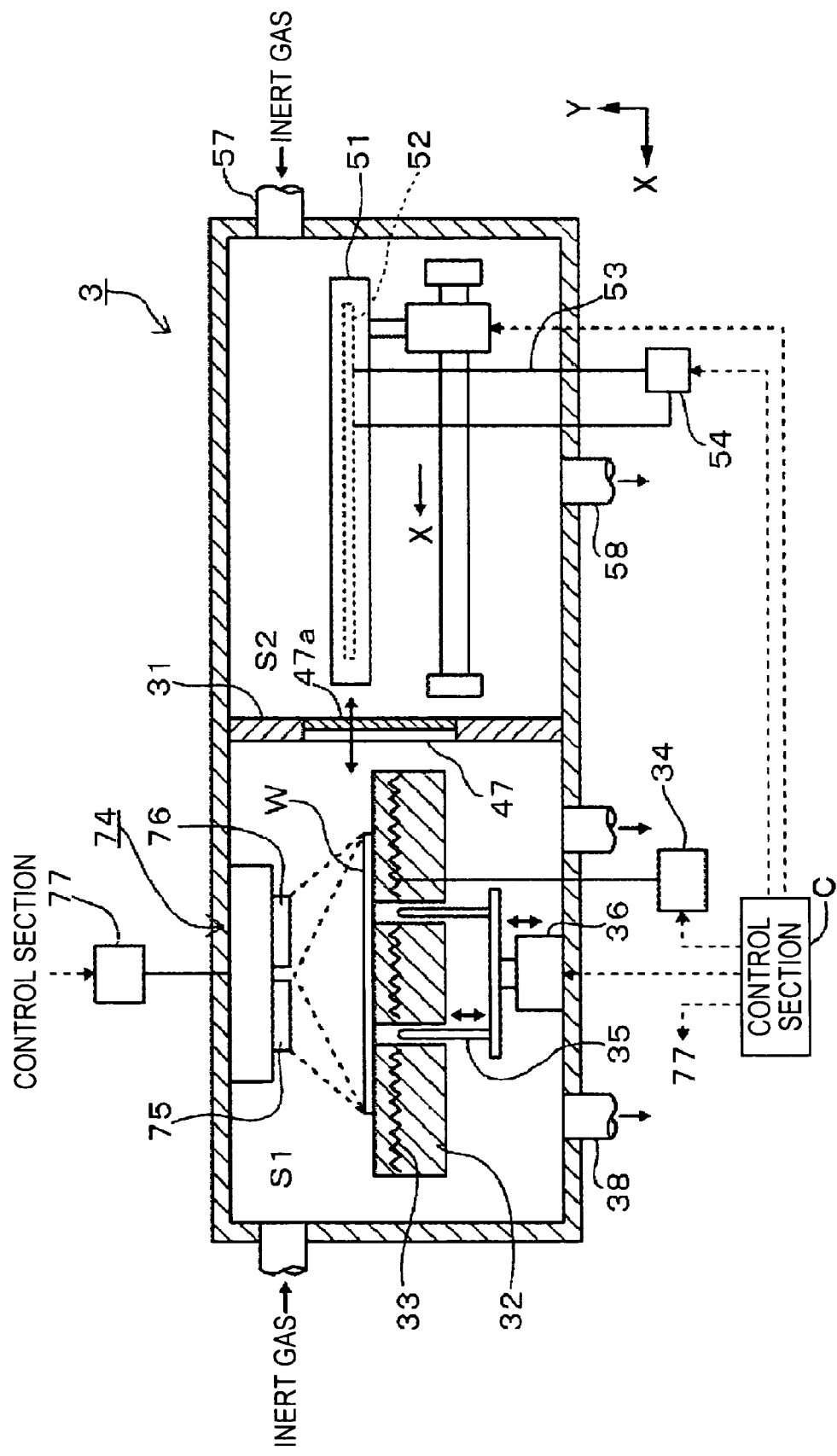
FIG. 10 is a cross-sectional view showing still another embodiment of the hardening processing apparatus.

In the above configuration, it is also adoptable to attach to a first irradiation unit 74 in the first processing chamber S1 a plurality of light sources, for example, a first light source 75 and a second light source 76 that irradiate with ultraviolet lights having different wavelengths, as shown in FIG. 10, one of which is a light source for curing processing and the other is a light source for quality improvement. A controller 77 also has a function of making a change between the first light source 75 and the second light source 76. Further, it is also possible to use EB (electron beam) for the curing processing in the first processing chamber S1.

Figure 11:
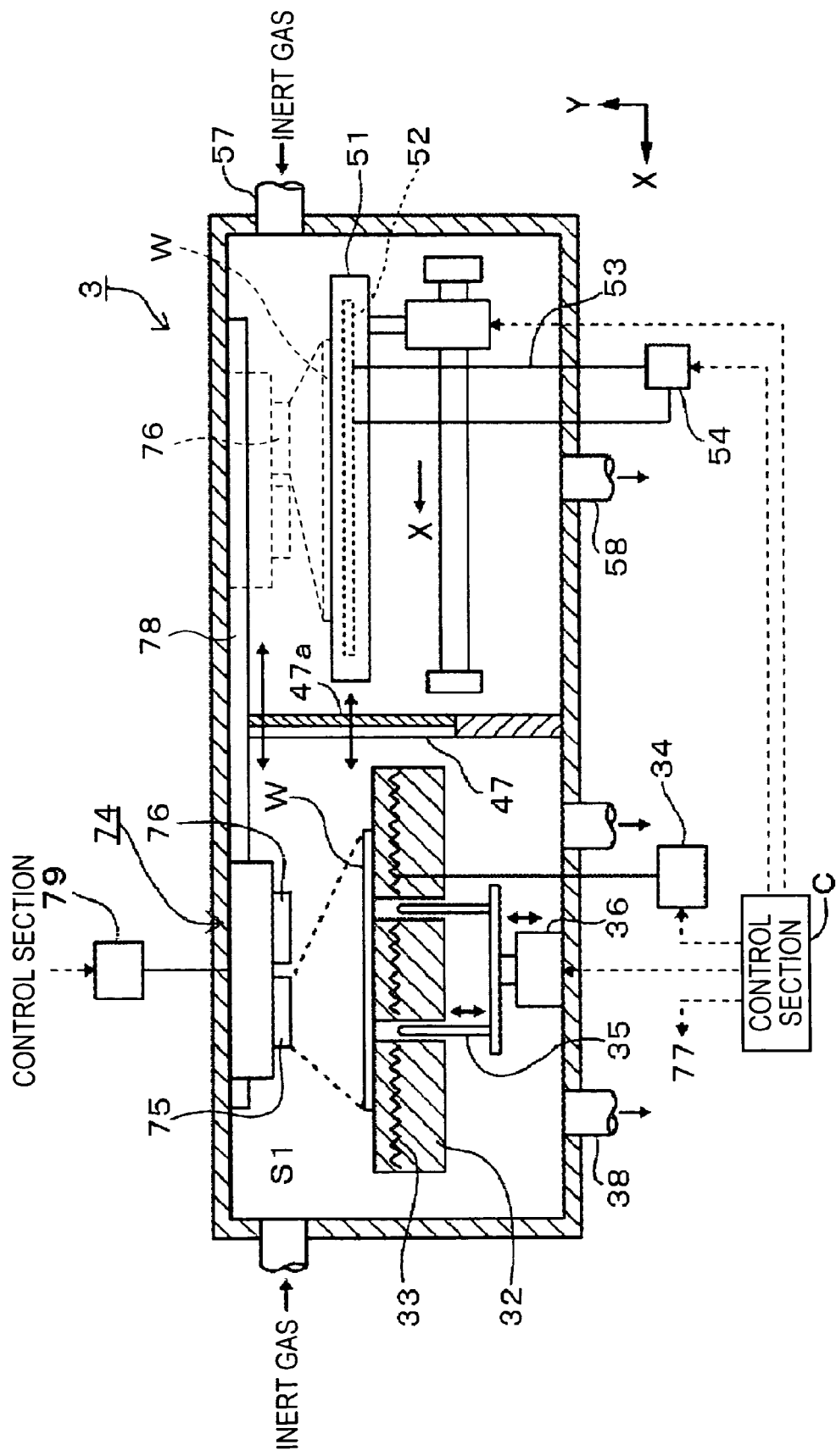
FIG. 11 is a cross-sectional view showing yet another embodiment of the hardening processing apparatus.

It should be noted that when the irradiation unit 74 includes the first light source 75 and the second light source 76 that are two light sources having different wavelengths as described above, the irradiation unit 74 may be configured to move itself between the first processing chamber S1 and the second processing chamber S2 as shown in FIG. 11. For example, a rail 78 extending over the two processing chambers is attached to both ceilings thereof so that the irradiation unit 74 is made movable along the rail 78.

In the above-described configuration, by providing only one irradiation unit 74 in one unit, it becomes possible to implement in two processing chambers different kinds of processing respectively, that is, the curing processing using the first light source 75 in the first processing chamber S1 and the quality improving processing using the second light source 76 in the second processing chamber S2. A control unit 79 in this case also controls a change between the light sources and movement of the irradiation unit 74.

Figure 12:
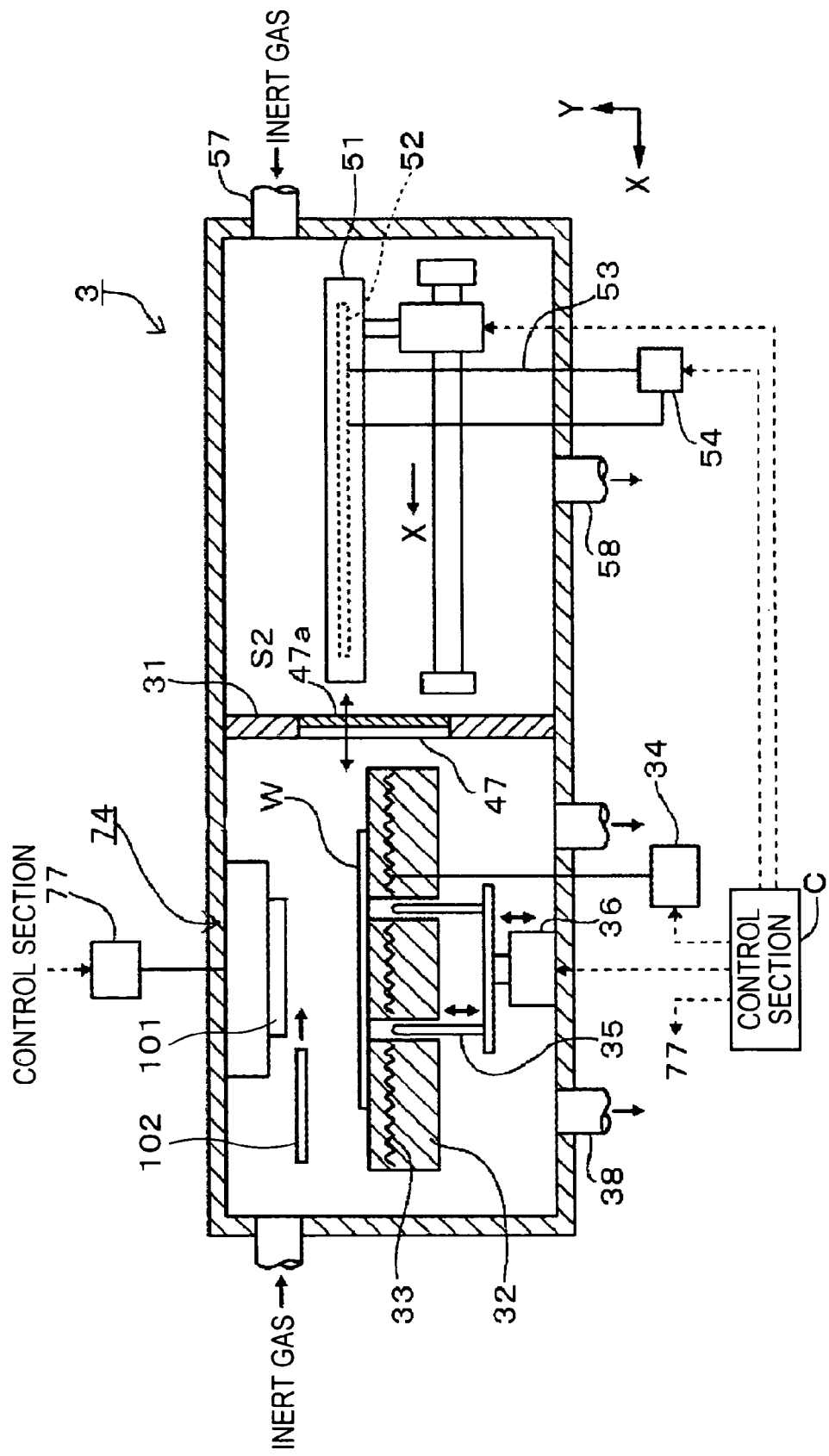
FIG. 12 is a cross-sectional view showing further another embodiment of the hardening processing apparatus.

For example, when the wavelength regions of the ultraviolet light for curing processing and the ultraviolet light for quality improvement are close to each other and when the wavelength of the ultraviolet light for quality improvement can be secured by combining the light source for curing processing with a filter, a light source 101 of the irradiation unit 74 and a filter 102 may be combined as shown in FIG. 12 to perform both the curing processing and the quality improving processing by one light source. In other words, attachment or removal of the filter 102 enables irradiation of the wafer W with the ultraviolet lights having different wavelengths, and therefore it is only required to prepare one light source.

Meanwhile, the light source for ultraviolet irradiation, for example, an ultraviolet lamp deteriorates with time during use and might decrease in irradiation energy with the deterioration. The decreased energy might not attain predetermined hardening processing, and therefore the light source should be replaced with another.

However, even if the light source is not immediately replaced, it is possible to supply the ultraviolet light having predetermined energy to the wafer W by making the wafer W to be irradiated closer to the light source than the initial state for complement to the decrease of energy.

Figure 13:
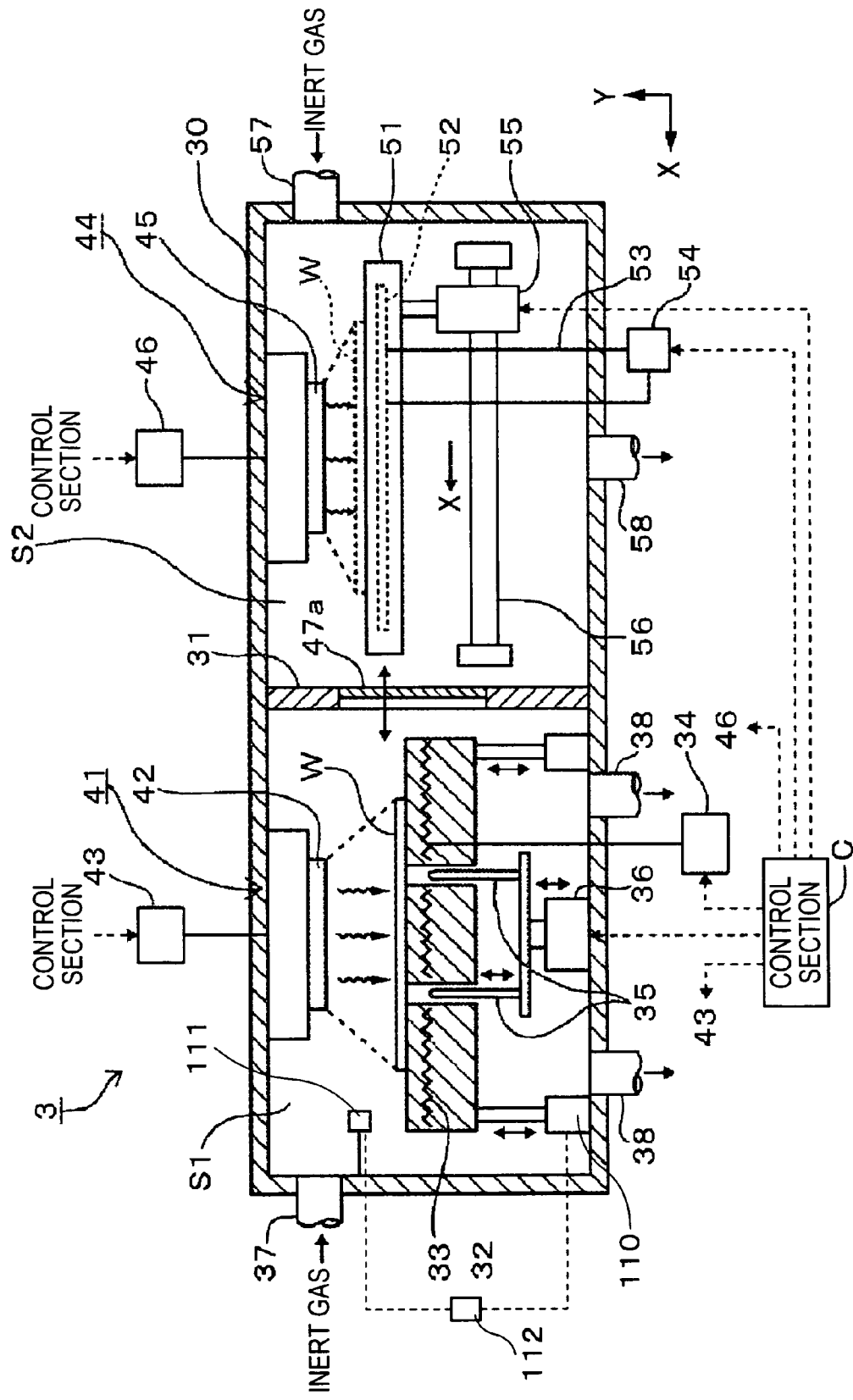
FIG. 13 is a cross-sectional view showing still further another embodiment of the hardening processing apparatus.

To realize this complement, the heating plate 32 is made movable up and down by a drive mechanism 110 as shown in FIG. 13. As a result of this, when the irradiation energy decreases caused by deterioration of the first light source 42, the heating plate 32 can be raised in accordance with the decrease to make the position of the wafer W closer to the first light source 42, whereby the wafer W can be irradiated with the ultraviolet light having the predetermined energy.

In this case, a sensor 111 for measuring the strength of the energy of applied ultraviolet light is provided, for example, in the first processing chamber S1, and a controller 112 is provided that judges the degree of deterioration by a signal from the sensor 111 and controls the amount of raising the heating plate 32 by the drive mechanism 110 based on the judgment result, whereby it becomes possible to irradiate the wafer W with ultraviolet light of a predetermined amount of energy at all times irrespective of the deterioration of the first light source 42. Further, this enables substantial extension of the life of, for example, an ultraviolet lamp used for the first light source 42.

The above-described sensor 111 and controller 112 may be applied to the second light source 45 in the second processing chamber S2.

Although the wafer is irradiated with ultraviolet light in the curing processing in the above-described embodiment, it is also adoptable to perform curing processing without irradiation with ultraviolet light, thereafter irradiate the wafer with ultraviolet light having a predetermined wavelength of, for example, about 150 nm to about 200 nm, and then perform cooling processing (first cooling processing) for the wafer. In this arrangement, a coating film that is hard and has a K value of 2.9 or lower can be obtained. In this case, the ultraviolet irradiation after curing may be performed for the wafer on the heating plate 32 in the first processing chamber S1 by the first irradiation unit 41 or for the wafer on the temperature adjusting plate 51 in the second processing chamber S2 by the second irradiation unit 44.

Furthermore, it is also adoptable to irradiate the coating film on the wafer with electromagnetic wave within the ultraviolet region during performance of the baking processing. The irradiation with the electromagnetic wave having a predetermined wavelength during the baking processing provides an effect that the processing will be completed in a shorter time than in the case of that only by thermal processing. In this case, a preferable wavelength ranges about 150 nm to about 500 nm.

In addition, in the present invention, each of the configurations of the coating unit and the curing unit is not limited to the above-described one as long as the predetermined processing is performed therein. Further, it is adoptable to arrange, in the shelf units U1 and U2, a low temperature heating unit for performing processing of drying a solvent in the coating solution applied on the front surface of the wafer by heat and a cooling unit for performing processing of cooling the wafer after curing processing to a predetermined temperature, depending on the kind of the coating film to be formed on the wafer.

Furthermore, the present invention is applicable to the formation of not only an organic SOD film but also an inorganic SOD film. In this case, for example, MSQ is used as the coating solution, and the baking processing is performed under the condition of an oxygen concentration of 1000 ppm or lower and a processing temperature of 80° C. to 200° C., the curing processing is performed under the condition of an oxygen concentration of 100 ppm or lower and a processing temperature of 350° C. to 425° C., the ultraviolet light applied during the curing processing is 100 nm to 200 nm in wavelength and 100 $J/cm^2$ to 300 $J/cm^2$ in the amount of irradiation, and the ultraviolet light applied during the quality improvement is 150 nm to 200 nm in wavelength and 100 $J/cm^2$ in the amount of irradiation.

Moreover, the present invention is applicable not only to the formation a low dielectric interlayer insulating film by the SOD method but also to the formation of an SOG (Spin On Glass) film and the formation of a resist film, polyimide film, ferroelectric film, other insulating films, and so on. The SOG film here is an $SiO^2$ film to be formed on the front surface of a film formed by a CVD method to flatten the film because the front surface of the film formed by the CVD method is in a state of projections and depressions. The SOG film is formed by applying a coating solution by spin coating onto the front surface of a wafer, similarly to the SOD method, and then performing heating processing for the wafer to thereby vaporize a solvent and so on contained in the coating solution so as to harden the film.

Besides, the apparatus for processing a semiconductor wafer is described in the above embodiments, but the present invention is also applicable to an apparatus for processing a glass substrate for use in an FPD (flat panel display), a mask, and so on.

According to the present invention, since the ultraviolet light is applied during the hardening processing of the coating film, the temperature of the hardening processing can be lowered.

What is claimed is:

1. A hardening processing apparatus for heating a substrate coated with a coating solution to harden a coating film on the substrate, comprising:
    a first processing chamber for mounting the substrate coated with the coating solution on a heating plate and heating the substrate to a predetermined temperature on a one-by-one basis;
    a first irradiation unit provided in said first processing chamber, for irradiating the substrate mounted on said heating plate with ultraviolet light;
    a second processing chamber connected in a communicating manner to said first processing chamber, for mounting the substrate coated with the coating solution on a temperature adjusting plate and adjusting the substrate to a temperature lower than a processing temperature of hardening processing on a one-by-one basis; and
    a second irradiation unit provided in said second processing chamber for irradiating the substrate mounted on said temperature adjusting plate with ultraviolet light having a wavelength different from that of said first irradiation unit.

2. The hardening processing apparatus as set forth in claim 1, wherein
    the substrate is heated by said heating plate while being irradiated with the ultraviolet light by said first irradiation unit so that the coating film on the substrate is hardened.

3. The hardening processing apparatus as set forth in claim 1, wherein
    said temperature adjusting plate is movable between a position above said heating plate in said first processing chamber and said second processing chamber.

4. The hardening processing apparatus as set forth in claim 1, further comprising:
    a control section for performing, in said first processing chamber:
    heating processing of mounting the substrate coated with the coating solution on said heating plate and heating the substrate at a first temperature; and
    hardening processing of subsequently heating the substrate, for which the heating processing has been performed, kept mounted on said heating plate at a temperature of the hardening processing that is higher than the first temperature, and irradiating the substrate with the ultraviolet light to harden the coating film on the substrate.

5. The hardening processing apparatus as set forth in claim 4, wherein
    the coating film is an insulating film, and the heating processing is low oxygen heating processing of heating the substrate in a low oxygen atmosphere to cause condensation polymerization reaction of the coating film to thereby chemically harden the coating film.

6. The hardening processing apparatus as set forth in claim 4, wherein said second irradiation unit irradiates the substrate with the ultraviolet light to thereby perform quality improving processing of the coating film.

7. The hardening processing apparatus as set forth in claim 1, further comprising:
    a control section for performing:
    heating processing of mounting the substrate coated with the coating solution on said temperature adjusting plate and heating the substrate at a first temperature in said second processing chamber; and
    hardening processing of mounting the substrate, for which the heating processing has been performed, on said heating plate and heating the substrate at a temperature of the hardening processing that is higher than the first temperature, and irradiating the substrate with the ultraviolet light to harden the coating film on the substrate in said first processing chamber.

8. The hardening processing apparatus as set forth in claim 1, further comprising:
    an inert gas supply unit for supplying an inert gas to said first processing chamber and said second processing chamber; and an exhaust unit for exhausting said first processing chamber and said second processing chamber.

9. The hardening processing apparatus as set forth in claim 1, wherein
    the coating film is an insulating film, and the ultraviolet light applied from said first irradiation unit to the substrate is ultraviolet light having a wavelength of 300 nm to 400 nm.

10. The hardening processing apparatus as set forth in claim 1, wherein
    the coating film is an insulating film, and said second irradiation unit irradiates the substrate with the ultraviolet light to thereby perform quality improving processing of the insulating film.

11. A hardening processing apparatus for heating a substrate coated with a coating solution to harden a coating film on the substrate, comprising:
    a first processing chamber for mounting the substrate coated with the coating solution on a heating plate which is movable up and down and heating the substrate to a predetermined temperature on a one-by-one basis;
    a first irradiation unit provided in said first processing chamber for irradiating the substrate mounted on said heating plate with ultraviolet light;
    a sensor for judging deterioration of said first irradiation unit in said first processing chamber;
    a controller for raising said heating plate based on a signal from said sensor; and
    a second processing chamber connected in a communicating manner to said first processing chamber for mounting the substrate coated with the coating solution on a temperature adjusting plate and adjusting the substrate to a temperature lower than a processing temperature of hardening processing on a one-by-one basis.

12. The hardening processing apparatus as set forth in claim 11, further comprising:
- a control section for performing, in said first processing chamber:
- heating processing of mounting the substrate coated with the coating solution on said heating plate and heating the substrate at a first temperature; and
- hardening processing of subsequently heating the substrate for which the heating processing has been performed, kept mounted on said heating plate at a temperature of the hardening processing that is higher than the first temperature, and irradiating the substrate with the ultraviolet light to harden the coating film on the substrate.

13. The hardening processing apparatus as set forth in claim 11, further comprising:
- a control section for performing:
- heating processing of mounting the substrate coated with the coating solution on said temperature adjusting plate and heating the substrate at a first temperature in said second processing chamber; and
- hardening processing of mounting the substrate, for which the heating processing has been performed, on said heating plate and heating the substrate at a temperature of the hardening processing that is higher than the first temperature and irradiating the substrate with the ultraviolet light to harden the coating film on the substrate in said first processing chamber.

14. The hardening processing apparatus as set forth in claim 13, wherein said temperature adjusting plate is movable between a position above said heating plate in said first processing chamber and said second processing chamber, and
- after the temperature adjusting plate, on which the substrate for which the heating processing at the first temperature has been performed is mounted, is positioned above a heating plate, a raising and lowering member is raised so that the substrate is transferred from said heating plate to said temperature adjusting plate, said temperature adjusting plate moving to an outside of the heating plate, and subsequently the raising and lowering member is lowered so that the substrate is transferred from said temperature adjusting plate to said heating plate.

15. The hardening processing apparatus as set forth in claim 14, further comprising:
- a second irradiation unit for irradiating the substrate with the hardened coating film, with ultraviolet light having a wavelength different from that of said first irradiation unit, and
- said second irradiation unit irradiates the substrate with the ultraviolet light to thereby perform quality improving processing of the coating film.

16. The hardening processing apparatus as set forth in claim 11, wherein the coating film is an insulating film and the ultraviolet light applied from said first irradiation unit to the substrate is ultraviolet light having a wavelength of 300 nm to 400 nm.

17. The hardening processing apparatus as set forth in claim 12, wherein the coating film is an insulating film and the heating processing is low oxygen heating processing of heating the substrate in a low oxygen atmosphere to cause condensation polymerization reaction of the coating film to thereby chemically harden the coating film.

18. A hardening processing apparatus for heating a substrate coated with a coating solution to harden a coating film on the substrate, comprising:
- a first processing chamber for mounting the substrate coated with the coating solution on a heating plate and heating the substrate to a predetermined temperature on a one-by-one basis;
- a first irradiation unit provided in said first processing chamber for irradiating the substrate mounted on said heating plate with ultraviolet light;
- a second processing chamber connected in a communicating manner to said first processing chamber for mounting the substrate coated with the coating solution on a temperature adjusting plate and adjusting the substrate to a temperature lower than a processing temperature of hardening processing on a one-by-one basis,
- said first irradiation unit is capable of applying ultraviolet lights having two different wavelengths, and said first irradiation unit is movable between said first processing chamber and said second processing chamber.

* * * * *